US012813175B2

(12) United States Patent
Guiot

(10) Patent No.: US 12,813,175 B2
(45) Date of Patent: Nov. 24, 2026

(54) METHOD FOR PRODUCING A SUBSTRATE FOR THE EPITAXIAL GROWTH OF A LAYER OF A GALLIUM-BASED III-N ALLOY

(71) Applicant: Soitec, Bernin (FR)

(72) Inventor: Eric Guiot, Bernin (FR)

(73) Assignee: Soitec, Bernin (FR)

( * ) Notice: Subject to any disclaimer, the term of this patent is extended or adjusted under 35 U.S.C. 154(b) by 593 days.

(21) Appl. No.: 18/245,139

(22) PCT Filed: Oct. 4, 2021

(86) PCT No.: PCT/FR2021/051710
§ 371 (c)(1),
(2) Date: Mar. 13, 2023

(87) PCT Pub. No.: WO2022/074319
PCT Pub. Date: Apr. 14, 2022

(65) Prior Publication Data
US 2023/0411151 A1 Dec. 21, 2023

(30) Foreign Application Priority Data
Oct. 6, 2020 (FR) ........................................ 2010208

(51) Int. Cl.
*H10P 14/60* (2026.01)
*C30B 29/36* (2006.01)
(Continued)

(52) U.S. Cl.
CPC .......... *H10P 14/6349* (2026.01); *C30B 29/36* (2013.01); *C30B 29/406* (2013.01);
(Continued)

(58) Field of Classification Search
CPC ......... H01L 21/02293; H01L 21/02167; H01L 21/02447; H01L 21/02513; H01L 21/0254;
(Continued)

(56) References Cited

U.S. PATENT DOCUMENTS 9,231,064 B1 * 1/2016 Reza .................. H10D 30/4735
2005/0269671 A1 * 12/2005 Faure ...................... C30B 29/36 257/E29.253
(Continued)

FOREIGN PATENT DOCUMENTS

CN 1779950 A 5/2006
CN 1985368 A 6/2007
(Continued)

OTHER PUBLICATIONS

Guziewicz et al., Comparative Study on Stress in ALGaN/GaN HEMT Structures Grown on 6H-SiC, Si and on composite substrates of the 6H-SiC, Si and on composite Substrates oft he 6H-SiC/poly-SiC and Si/poly-SiC, Journal of Physics: Conference Series 100, (2008), 5 pages.
(Continued)

*Primary Examiner* — Norman D Richards
*Assistant Examiner* — Sean Ayers Winters
(74) *Attorney, Agent, or Firm* — TraskBritt

(57) ABSTRACT

A method of fabricating a substrate for epitaxial growth of a layer of gallium nitride (GaN), aluminum gallium nitride (AlGaN) or indium gallium nitride (InGaN), comprises the following successive steps:
- providing a base substrate comprising at least one layer of single-crystal silicon carbide,
- performing epitaxial growth of a layer of semi-insulating SiC having a thickness larger than 1 µm on the layer of single-crystal SiC to form a donor substrate, (Continued)

implanting ionic species into the layer of semi-insulating SiC so as to form a weakened region defining a thin layer of single-crystal semi-insulating SiC to be transferred, bonding the layer of semi-insulating SiC directly to a receiver substrate having a high electrical resistivity, and detaching the donor substrate along the weakened region so as to transfer the thin layer of single-crystal semi-insulating SiC to the receiver substrate.

20 Claims, 10 Drawing Sheets

(51) Int. Cl.

| | |
|---|---|
| ***C30B 29/40*** | (2006.01) |
| ***C30B 31/22*** | (2006.01) |
| ***H10D 30/01*** | (2025.01) |
| ***H10P 14/20*** | (2026.01) |
| ***H10P 14/69*** | (2026.01) |
| ***H10P 72/70*** | (2026.01) |

(52) U.S. Cl.
CPC ........... *C30B 31/22* (2013.01); *H10D 30/015* (2025.01); *H10P 14/3208* (2026.01); *H10P 14/3256* (2026.01); *H10P 14/3416* (2026.01); *H10P 14/6905* (2026.01); *H10P 72/74* (2026.01); *H10P 72/7432* (2026.01)

(58) Field of Classification Search
CPC ...... H01L 21/6835; H01L 2221/68363; H10D 30/015; C30B 29/36; C30B 29/406; C30B 31/22; H10P 14/6349; H10P 14/6905; H10P 14/3208; H10P 72/74; H10P 14/3256; H10P 14/3416; H10P 72/7432
See application file for complete search history.

(56) References Cited

U.S. PATENT DOCUMENTS

2006/0099776 A1 5/2006 Dupont
2007/0080372 A1 4/2007 Faure et al.
2011/0127581 A1* 6/2011 Bethoux ............... H01L 21/187 117/106
2013/0313575 A1* 11/2013 Chen ........................ C30B 23/00 257/77
2013/0320275 A1* 12/2013 Zwieback .............. H01B 3/025 117/84
2014/0234194 A1* 8/2014 Zwieback ............... C30B 23/02 118/726
2014/0264374 A1* 9/2014 Hecht ............... H01L 21/02529 257/77
2016/0315211 A1* 10/2016 Chandrashekhar ... H10F 71/121
2017/0033010 A1 2/2017 Rupp et al.
2018/0082841 A1* 3/2018 Tawara ................... C30B 29/36
2020/0266292 A1 8/2020 Li et al.

FOREIGN PATENT DOCUMENTS

| | | | |
|---|---|---|---|
| CN | 104051242 | A | 9/2014 |
| CN | 104364428 | A | 2/2015 |
| EP | 1653504 | A1 | 5/2006 |
| FR | 2894989 | B1 | 1/2009 |
| JP | 2006-140445 | A | 6/2006 |
| JP | 2007-519262 | A | 7/2007 |
| JP | 2008-501229 | A | 1/2008 |
| JP | 2009-164301 | A | 7/2009 |
| JP | 2010-062168 | A | 3/2010 |
| JP | 2016-139655 | A | 8/2016 |
| JP | 2017-034254 | A | 2/2017 |
| JP | 2019-201205 | A | 11/2019 |
| KR | 10-2006-0052286 | A | 5/2006 |
| KR | 10-2020-0044728 | A | 4/2020 |
| TW | 200635014 | A | 10/2006 |
| WO | 2006/000691 | A1 | 1/2006 |
| WO | 2011/145310 | A1 | 11/2011 |

OTHER PUBLICATIONS

International Search Report for Application No. PCT/FR2021/051710 dated Feb. 1, 2022, 3 pages.
International Written Opinion for Application No. PCT/FR2021/051710 dated Feb. 1, 2022, 7 pages.
Taiwanese Office Action for Application No. 11321248440 dated Dec. 3, 2024, 14 pages with machine translation.
Korean Preliminary Rejection for Application No. 10-2023-7015261 dated Jun. 2, 2025, 18 pages with English translation.
French Office Action for Application No. 2010208 dated Feb. 17, 2023, 6 pages with machine translation.
French Search Report and Written Opinion for Application No. 2010208 dated Jun. 15, 2021, 19 pages with machine translation.
Japanese Notice of Reasons for Refusal for Application No. 2023-518172 dated Jul. 2, 2025, 13 pages with English translation.
Singapore Written Opinion for Application No. 11202302486W dated Jul. 4, 2025, 8 pages.
Korean Office Action for Application No. 10-2023-7015261 dated Feb. 12, 2026, 7 pages with machine translation.
CN Office Action, Including Search report received for Chinese Patent Application No. 202180065281.7, mailed on Sep. 12, 2026, 16 pages with machine translation.

* cited by examiner

METHOD FOR PRODUCING A SUBSTRATE FOR THE EPITAXIAL GROWTH OF A LAYER OF A GALLIUM-BASED III-N ALLOY

CROSS-REFERENCE TO RELATED APPLICATIONS

This application is a national phase entry under 35 U.S.C. § 371 of International Patent Application PCT/FR2021/051710, filed Oct. 4, 2021, designating the United States of America and published as International Patent Publication WO 2022/074319 A1 on Apr. 14, 2022, which claims the benefit under Article 8 of the Patent Cooperation Treaty to French Patent Application Serial No. FR2010208, filed Oct. 6, 2020.

TECHNICAL FIELD

The present disclosure relates to a process for fabricating a substrate for the epitaxial growth of a layer of a III-N alloy based on gallium (e.g., a layer of gallium nitride (GaN), of aluminum gallium nitride (AlGaN) or of indium gallium nitride (InGaN)), to a process for fabricating such a layer of III-N alloy, and to a process for fabricating a high-electron-mobility transistor (HEMT) in such a layer of III-N alloy.

BACKGROUND

III-N semiconductors, in particular, gallium nitride (GaN), aluminum gallium nitride (AlGaN) or indium gallium nitride (InGaN), appear to be particularly promising, in particular, as regards formation of high-power light-emitting diodes (LEDs) and of electronic devices operating at high frequency, i.e., devices such as high-electron-mobility transistors (HEMTs) or other field-effect transistors (FETs).

In so far as these III-N alloys are difficult to find in the form of bulk substrates of large size, they are generally formed by heteroepitaxy, i.e., by epitaxy on a substrate made of a different material.

The selection of such a substrate, in particular, takes into account the difference in lattice parameter and the difference in coefficient of thermal expansion between the material of the substrate and the III-N alloy. Specifically, the larger these differences, the greater the risk of formation, in the gallium nitride, of crystal defects such as dislocations, and the greater the risk of generation of high mechanical stresses, liable to cause excessive strains.

The materials most frequently considered for the heteroepitaxy of III-N alloys are sapphire and silicon carbide (SiC).

Apart from its small difference in lattice parameter with gallium nitride, silicon carbide is particularly preferred for high-power electronic applications because of its thermal conductivity, which is clearly higher than that of sapphire, and which therefore allows the thermal energy generated during component operation to be more easily dissipated.

In radiofrequency (RF) applications, it is sought to use semi-insulating silicon carbide, i.e., silicon carbide that has an electrical resistivity higher than or equal to $10^5$ Ω·cm, to minimize parasitic losses (generally called RF losses) in the substrate. However, this material is particularly expensive and currently is available only in the form of substrates of limited size.

Silicon would allow fabricating costs to be drastically decreased and substrates of large size to be accessed, but structures of III-N-alloy-on-silicon type are penalized by RF losses and by a poor dissipation of heat.

Composite structures, such as SopSiC or SiCopSiC structures, have also been investigated [1] but have not proved to be entirely satisfactory. These structures comprise a layer of single-crystal silicon or a layer of single-crystal SiC (intended to form a seed layer for the epitaxial growth of the gallium nitride) on a polycrystalline SiC substrate, respectively. Although polycrystalline SiC is a material that is inexpensive, that is available in the form of substrates of large size and that dissipates heat well, these composite structures are penalized by the presence of a layer of silicon oxide at the interface between the layer of single-crystal silicon or SiC and the polycrystalline SiC substrate, which forms a thermal barrier hindering the dissipation of heat from the layer of III-N alloy to the polycrystalline SiC substrate.

BRIEF SUMMARY

One aim of the present disclosure is therefore to remedy the aforementioned drawbacks and, in particular, limitations related to the size and cost of semi-insulating SiC substrates.

The aim of the present disclosure is therefore to provide a process for fabricating a substrate for the epitaxial growth of a III-N alloy based on gallium, in particular, with a view to forming HEMTs or other high-frequency, high-power electronic devices in which RF losses are minimized and the dissipation of heat is maximized.

To this end, the present disclosure provides a process for fabricating a substrate for epitaxial growth of a layer of gallium nitride (GaN), of aluminum gallium nitride (AlGaN) or of indium gallium nitride (InGaN), comprising the following successive steps:

- providing a base substrate comprising at least one layer of single-crystal silicon carbide,
- performing epitaxial growth of a layer of semi-insulating SiC on the layer of single-crystal SiC to form a donor substrate,
- implanting ionic species into the layer of semi-insulating SiC so as to form a weakened region that defines a thin layer of single-crystal semi-insulating SiC to be transferred,
- bonding the layer of semi-insulating SiC to a receiver substrate having a high electrical resistivity,
- detaching the donor substrate along the weakened region so as to transfer the thin layer of single-crystal semi-insulating SiC to the receiver substrate.

By "high-frequency," what is meant in the present text is a frequency higher than 3 kHz.

By "high-power," what is meant in the present text is a power density higher than 0.5 W/mm injected through the gate of the transistor.

By "high electrical resistivity," what is meant in the present text is an electrical resistivity higher than or equal to 100 Ω·cm.

By "semi-insulating SiC," what is meant in the present text is silicon carbide having an electrical resistivity higher than or equal to $10^5$ Ω·cm.

This process allows a base substrate of high electrical resistivity and of high thermal conductivity comprising a layer of semi-insulating SiC having a crystal quality suitable for the subsequent epitaxial growth of a layer of gallium nitride to be formed and the final structure to benefit from the good properties thereof as regards the dissipation of heat and the limitation of RF losses. Since the layer of semi-insulating SiC makes direct contact with the substrate of high electrical resistivity and of high thermal conductivity, the structure further contains no thermal barrier.

A process that consisted in forming the layer of semi-insulating SiC by epitaxy directly on a substrate of high electrical resistivity would lead to the formation of a high number of dislocations in the semi-insulating SiC because of the insufficient crystal quality of the substrate of high electrical resistivity or the difference in lattice parameter between the material of the substrate and silicon carbide. In contrast, the process according to the present disclosure makes it possible to use, as a seed for the growth of the semi-insulating SiC, a layer of single-crystal SiC, the quality of which is optimal because it was obtained via transfer from the donor substrate.

According to advantageous but optional features of the present disclosure, which may be implemented alone or in combination when this is technically possible:

- the receiver substrate has a difference in coefficient of thermal expansion with silicon carbide smaller than or equal to $3\times10^{-6}$ $K^{-1}$;
- the receiver substrate is chosen from a silicon substrate of high electrical resistivity, a substrate of polycrystalline SiC of high electrical resistivity, a polycrystalline AlN substrate, and a diamond substrate;
- the epitaxial layer of semi-insulating SiC has a thickness larger than or equal to 3 μm, preferably larger than or equal to 5 μm, and even more preferably larger than or equal to 10 μm;
- the thin layer transferred to the receiver substrate has a thickness smaller than 1 μm;
- the layer of semi-insulating SiC is formed by doping with vanadium during the epitaxial growth of the SiC;
- the process further comprises a step of recycling the segment of the donor substrate detached from the transferred layer, with a view to forming a new donor substrate;
- the recycling comprises polishing a residual segment of the layer of semi-insulating SiC, the new donor substrate thus obtained being able to be used in a new step of implanting ionic species;
- the recycling comprises polishing a residual segment of the layer of semi-insulating SiC and performing epitaxial regrowth to increase the thickness of the layer of semi-insulating SiC to form the new donor substrate;
- the recycling comprises removing a residual segment of the layer of semi-insulating SiC to uncover the carbon face of the layer of single-crystal SiC and performing epitaxial growth of a new layer of semi-insulating SiC on the carbon face of the layer of single-crystal SiC to form the new donor substrate;
- the layer of single-crystal silicon carbide of the base substrate has a free carbon face, the epitaxial growth of the layer of semi-insulating SiC is performed on the carbon face of the layer of single-crystal SiC, the ionic species are implanted through the carbon face of the layer of semi-insulating SiC, the carbon face of the layer of semi-insulating SiC is bonded to the receiver substrate, at the end of the detachment, the silicon face of the transferred layer of single-crystal semi-insulating SiC is uncovered;
- the process comprises fabricating the base substrate via the following successive steps: providing an initial substrate of single-crystal SiC having a silicon face; implanting ionic species through the silicon face of the initial substrate so as to form a weakened region that defines a thin layer of single-crystal SiC to be transferred; bonding the silicon face of the initial substrate to an intermediate carrier; detaching the initial substrate along the weakened region so as to transfer the thin layer of single-crystal SiC to the intermediate carrier and to uncover the carbon face of the transferred layer of single-crystal SiC, the intermediate carrier and the transferred layer of single-crystal SiC together forming the base substrate;
- the intermediate carrier is an SiC substrate having a crystal quality lower than that of the initial substrate;
- the initial substrate is bonded directly to the intermediate carrier after activation of each surface to be bonded by bombardment of neutral species;
- the initial substrate is bonded to the intermediate carrier by way of a refractory bonding layer;
- the process comprises a step of recycling the segment of initial substrate detached from the transferred layer, with a view to forming a new initial substrate.

Another subject of the present disclosure relates to a process for fabricating a layer of a III-N alloy based on gallium on a substrate obtained using the process that has just been described.

The process comprises:

- providing a substrate fabricated using the process described above,
- performing epitaxial growth of the layer of gallium nitride, of aluminum gallium nitride (AlGaN) or of indium gallium nitride (InGaN) on the layer of semi-insulating SiC of the substrate.

The layer of gallium nitride, of aluminum gallium nitride (AlGaN) or of indium gallium nitride (InGaN) has a thickness typically between 1 and 2 μm.

Another subject of the present disclosure relates to a process for fabricating a high-electron-mobility transistor (HEMT) in such a layer of III-N alloy based on gallium.

The process comprises:

- fabricating by epitaxy a layer of gallium nitride, of aluminum gallium nitride (AlGaN) or of indium gallium nitride (InGaN) using the aforementioned process,
- forming a heterojunction by epitaxy of a layer of a III-N material different from gallium nitride on the layer of gallium nitride, of aluminum gallium nitride (AlGaN) or of indium gallium nitride (InGaN),
- forming a channel of the transistor level with the heterojunction, and
- forming a source, a drain and a gate of the transistor on the channel.

BRIEF DESCRIPTION OF THE DRAWINGS

Further features and advantages of the present disclosure will become apparent from the following detailed description, with reference to the appended drawings, in which.

For the sake of legibility of the figures, the various layers have not necessarily been shown to scale.

DETAILED DESCRIPTION

The present disclosure provides a process for fabricating substrates for the epitaxial growth of binary or ternary III-N alloys based on gallium. The alloys comprise gallium nitride (GaN), aluminum gallium nitride ($Al_xGa_{1-x}N$, where $0<x<1$, designated in abbreviated form by AlGaN below) and indium gallium nitride ($In_xGa_{1-x}N$, where $0<x<1$, designated in abbreviated form by InGaN below). For the sake of conciseness, in the rest of the text the fabrication of a substrate for the epitaxial growth of a layer of GaN will be described; however, a person skilled in the art will be able to tailor the growth conditions to form a layer of AlGaN or InGaN, the substrate serving for this epitaxial growth remaining the same.

The process uses a base substrate of single-crystal silicon carbide (SiC) that serves as seed for the growth of a layer of semi-insulating SiC, to form a donor substrate. A thin layer of semi-insulating SiC of the donor substrate is then transferred using the Smart Cut™ process to a receiver substrate, having a high electrical resistivity.

To this end, a base substrate made of single-crystal SiC having an excellent crystal quality, i.e., in particular, SiC free of dislocations, will be chosen.

In certain embodiments, the base substrate may be a bulk substrate of single-crystal SiC. In other embodiments, the base substrate may be a composite substrate, comprising a superficial layer of single-crystal SiC and at least one other layer of another material. In this case, the layer of single-crystal SiC will have a thickness larger than or equal to 0.5 μm.

There are various crystal forms (also called polytypes) of silicon carbide. The most common are the forms 4H, 6H and 3C. Preferably, the single-crystal silicon carbide is chosen from the 4H and 6H polytypes, but any polytype may be used to implement embodiments of the present disclosure.

In the figures, a bulk base substrate 10 made of single-crystal SiC has been shown.

As known per se, as illustrated in FIG. 1, such a bulk base substrate 10 has a silicon face 10-Si and a carbon face 10-C.

At the present time, processes of epitaxy of GaN are mainly implemented on the silicon face of the SiC. However, it is not impossible to grow GaN on the carbon face of the SiC. The orientation of the base substrate (silicon face/carbon face) and therefore of the donor substrate during the implementation of the method is chosen depending on the face of the SiC intended for the growth of the layer of GaN.

Figure 1A:
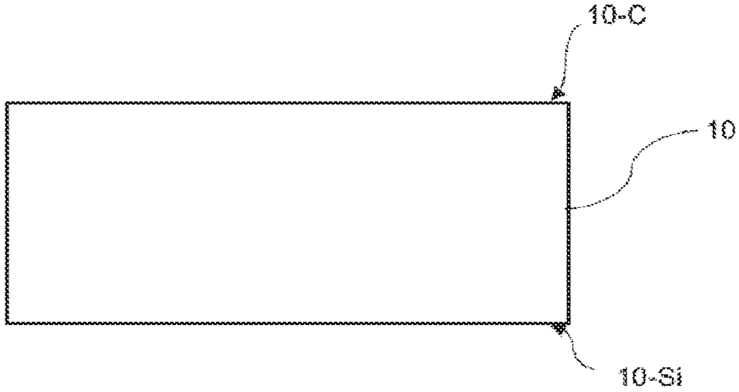
FIG. 1A is a schematic cross-sectional view of a single-crystal SiC base substrate.
Figure 1B:
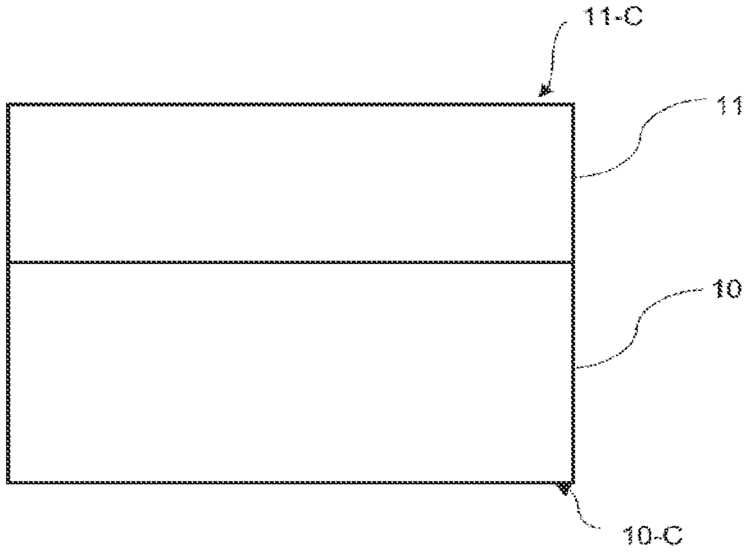
FIG. 1B is a schematic cross-sectional view of a donor substrate formed by epitaxial growth of a layer of single-crystal semi-insulating SiC on the C-face of the base substrate of FIG. 1A.

With reference to FIG. 1B, an epitaxial growth of a layer 11 of semi-insulating SiC on the base substrate 10 is performed. The polytype of the semi-insulating SiC is advantageously identical to that of the SiC of the donor substrate.

Advantageously, the growth of the layer 11 is performed on the carbon face 10-C of the substrate 10. It is therefore the carbon face 11-C of the semi-insulating SiC that is located on the surface of the donor substrate.

There are various techniques for forming semi-insulating SiC. According to one embodiment, the layer of SiC is doped with vanadium during its epitaxial growth. According to another embodiment, silicon, carbon and vanadium are simultaneously deposited using suitable precursors in an epitaxial reactor.

The layer of semi-insulating SiC advantageously has a thickness larger than the thickness of the layer to be subsequently transferred to the receiver substrate. Preferably, the layer of semi-insulating SiC has a thickness larger that a plurality of times the thickness of the layer to be transferred. Thus, the donor substrate will possibly be used a plurality of times to transfer a layer of semi-insulating SiC, this making the process more economical. For example, the epitaxial layer of semi-insulating SiC preferably has a thickness larger than 3 μm, more preferably larger than or equal to 5 μm, and even larger than or equal to 10 μm.

Since semi-insulating SiC is a rare material, the proposed production process allows the lack of availability of semi-insulating SiC substrates on the market to be overcome.

Figure 1C:
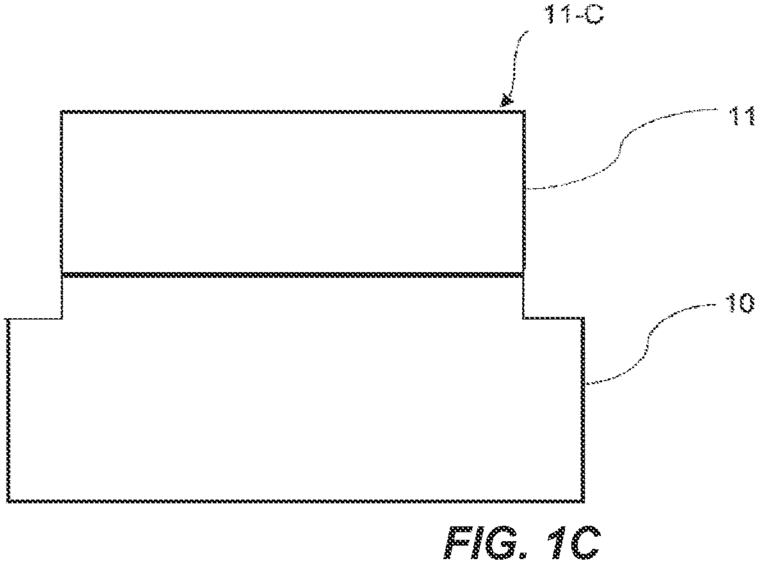
FIG. 1C is a schematic cross-sectional view of the donor substrate after trimming intended to remove an SiC outgrowth formed on the edges of the substrate during the epitaxy.

With reference to FIG. 1C, the layer 11 of semi-insulating SiC and a subjacent segment of the base substrate 10 is trimmed. Such trimming is motivated by the fact that, during the epitaxy of the semi-insulating SiC, an extra thickness of semi-insulating SiC forms on the edges of the base substrate. However, the tools present on the fabrication lines of semiconductor devices are generally designed for a set substrate diameter, also called the nominal diameter. Trimming therefore allows the diameter of the epitaxial layer of semi-insulating SiC to be returned to the nominal diameter. This trimming step is carried out using an edge-grinding tool, which removes from the edge of the layer a few hundred microns of width and a few tens of microns of depth.

Figure 1D:
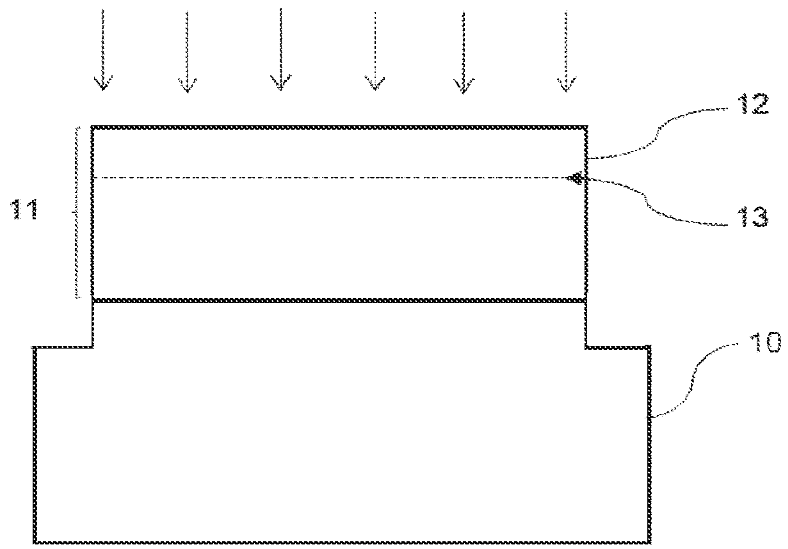
FIG. 1D is a schematic cross-sectional view of the donor substrate of FIG. 1C during the formation of a weakened region via implantation of ionic species in the layer of semi-insulating SiC to define a thin layer to be transferred.

With reference to FIG. 1D, ionic species are implanted into the layer 11 of semi-insulating SiC of the donor substrate, so as to form a weakened region 13 that defines a thin layer 12 of single-crystal semi-insulating SiC. The implanted species typically comprise hydrogen and/or helium. A person skilled in the art will be able to define the required implantation dose and energy.

In the illustrated embodiment, on account of the initial orientation of the base substrate, the ionic species are implanted through the carbon face 11-C of the donor substrate.

Preferably, the thin layer 12 of single-crystal semi-insulating SiC has a thickness smaller than 1 μm. Specifically, such a thickness is accessible on an industrial scale with the Smart Cut™ process. In particular, the implantation devices available on industrial fabrication lines allow such an implantation depth to be obtained.

Figure 1E:
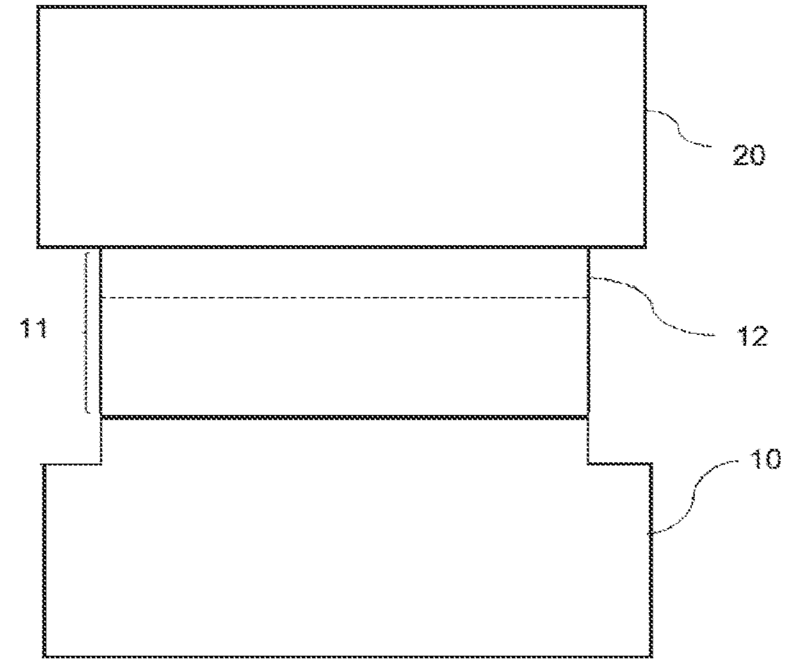
FIG. 1E is a schematic cross-sectional view of assembly of a receiver substrate and of the donor substrate of FIG. 1D.

With reference to FIG. 1E, a receiver substrate 20 having a high electrical resistivity is moreover provided.

The main function of the receiver substrate is to form, with the layer 12 of semi-insulating SiC transferred to the receiver substrate, a substrate suitable for the epitaxial growth of GaN.

Since the epitaxy is performed at high temperatures, the receiver substrate is preferably chosen to have a coefficient of thermal expansion substantially equal to that of SiC, in order not to generate stress or strain during the epitaxy of the GaN. Thus, particularly advantageously, the receiver substrate has, with SiC, a difference in coefficient of thermal expansion smaller than or equal to $3\times10^{-6}$ $K^{-1}$ in absolute value.

Moreover, apart from its high electrical resistivity, the receiver substrate advantageously contributes to the dissipation of heat within the final structure. A material having a high thermal conductivity is therefore advantageously chosen for the receiver substrate.

Thus, preferred materials for the receiver substrate are: ceramics (for example, but non-limitingly polycrystalline SiC (pSiC), polycrystalline aluminum nitride (pAlN), beryllium oxide (BeO)), diamond, or, to a lesser extent, silicon of electrical resistivity higher than or equal to 100 Ω·cm (the thermal conductivity of the latter being lower than that of the other materials mentioned).

The layer 11 of semi-insulating SiC of the donor substrate is bonded to the receiver substrate 20. It is a question of direct bonding, i.e., bonding without use of a bonding layer—which would be liable to form a thermal barrier—interposed between the substrates.

Figure 1F:
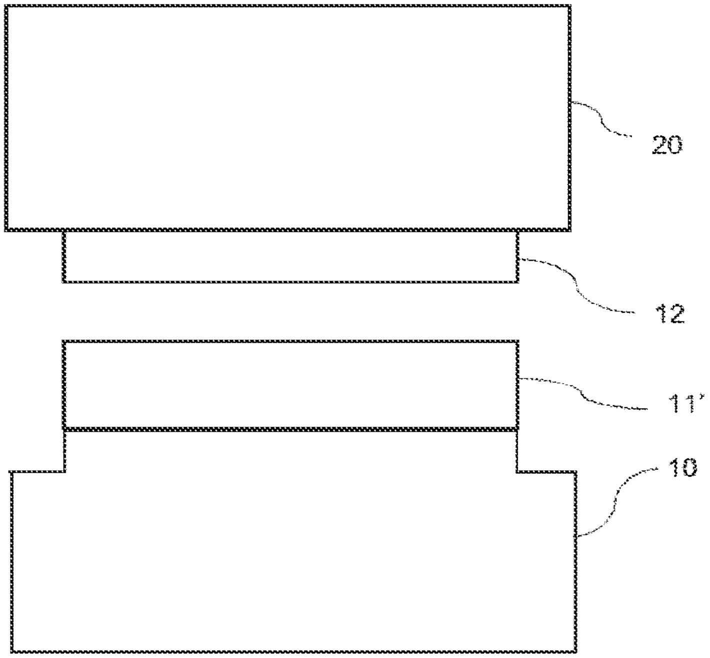
FIG. 1F is a schematic cross-sectional view of the donor substrate being detached along the weakened region to transfer the thin layer of single-crystal semi-insulating SiC to the receiver substrate.

With reference to FIG. 1F, the donor substrate is detached along the weakened region 13. In a way known per se, the detachment may be caused by a heat treatment, a mechanical action, or a combination of these means.

The effect of this detachment is to transfer the layer 12 of semi-insulating SiC to the receiver substrate 20.

Figure 1G:
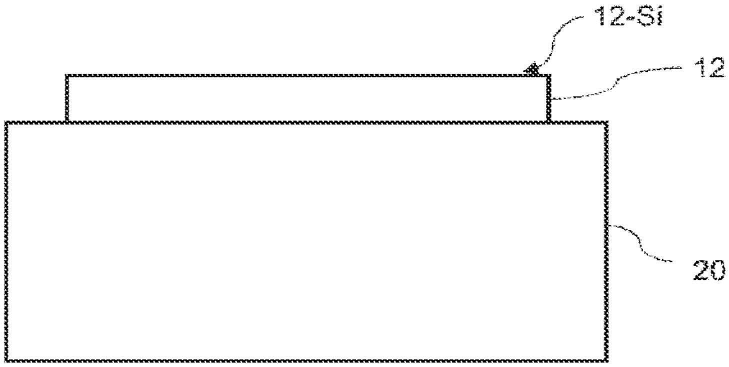
FIG. 1G is a schematic cross-sectional view of the thin layer of single-crystal semi-insulating SiC transferred to the receiver substrate after its free surface (silicon face) has been polished.

As illustrated in FIG. 1G, the free face of the transferred layer 12 of single-crystal SiC is the silicon face 12-Si (the carbon face being on the side of the interface with the receiver substrate 20). This face is polished, for example, by chemical-mechanical polishing (CMP), to decrease the roughness of the layer 12 and to remove defects related to the implantation.

The remainder of the donor substrate, which comprises the base substrate 10 and the segment 11' of the layer 11 of semi-insulating SiC that was not transferred to the receiver substrate 20 (see FIG. 1E), may advantageously be recycled with a view to a new use.

The mode of recycling may vary depending on the thickness of the residual segment 11'.

In the case where this thickness is very small, in particular, smaller than the thickness of a new layer of semi-insulating SiC to be transferred (i.e., typically smaller than 1 μm), the entirety of this segment may be removed to keep only the base substrate 10. The base substrate 10 may thus be reused in the process described starting from FIG. 1A, and may especially receive a new epitaxial layer of semi-insulating SiC as illustrated in FIG. 1B.

In the case where the thickness of the residual segment 11' of semi-insulating SiC is significant (i.e., typically larger than 1 μm), the segment 11' may be kept on the base substrate 10, after a polish of its surface.

If the thickness of the segment after polishing is larger than the thickness of the layer 12 to be transferred to a new receiver substrate, the structure comprising the base substrate 10 and of the segment 11' of semi-insulating SiC may be used as a new donor substrate in the process described above starting from the step described with reference to FIG. 1D.

Optionally, especially if the thickness of the segment 11' of semi-insulating SiC after polishing is smaller than the thickness of the layer 12 to be transferred to a new receiver substrate, a new thickness of semi-insulating SiC may be grown by epitaxial regrowth on the segment 11' after polishing, to obtain a layer of semi-insulating SiC having a sufficient thickness for the implementation of the process starting from the step described with reference to FIG. 1D.

Returning to the substrate of FIG. 1G, the substrate is suitable for growing a III-N alloy based on gallium on the transferred layer 12 of semi-insulating SiC.

Figure 1H:
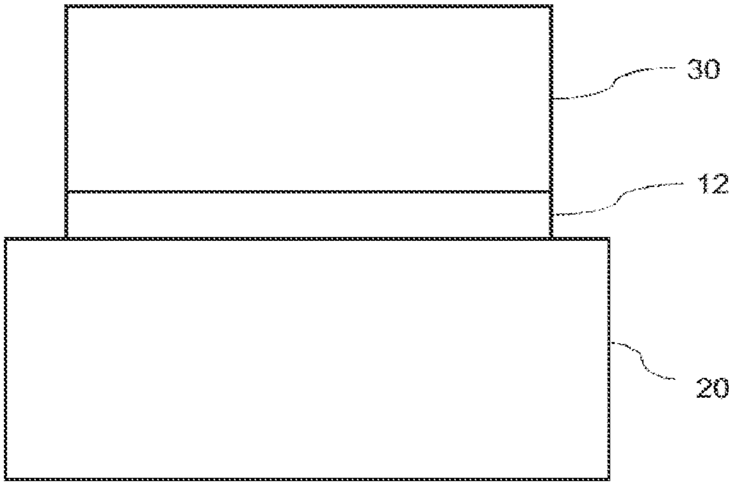
FIG. 1H is a schematic cross-sectional view of a layer of GaN being formed by epitaxy on the silicon face of the layer of single-crystal semi-insulating SiC of FIG. 1G.

With reference to FIG. 1H, a layer 30 of GaN (or, as mentioned above, of AlGaN or InGaN) is grown on the silicon face of the layer 12 of semi-insulating SiC. The thickness of the layer 30 is typically between 1 μm and 2 μm.

Figure 1I:
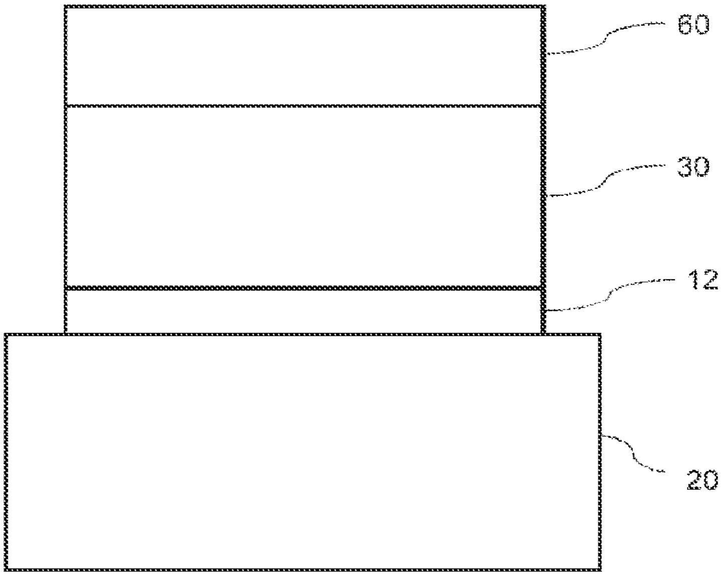
FIG. 1I is a schematic cross-sectional view of the formation by epitaxy of a heterojunction on the layer of GaN of FIG. 1H.

Next, as illustrated in FIG. 1I, a heterojunction is formed by growing, by epitaxy, on the layer 30, a layer 60 of a III-N alloy different from that of the layer 30.

It is thus possible to continue the fabrication of transistors, in particular, HEMTs, from this heterojunction, using processes known to those skilled in the art, the channel of the transistor being formed level with the heterojunction, and the source, drain and gate of the transistor being formed on the channel.

On account of the initial orientation of the base substrate 10 (the carbon face 10-C of which received the implantation and was bonded to the receiver substrate), it is the silicon face 12-Si of the layer of semi-insulating SiC that is uncovered on the final substrate, this being particularly favorable to the growth of GaN, of AlGaN or of InGaN.

One variant of the process described above, which especially allows a more conventional orientation of the single-crystal SiC, and in which it is the silicon face that receives the implantation and is bonded to the receiver substrate, will now be described.

To this end, the base substrate is formed by transferring a layer of single-crystal SiC from an initial substrate to an intermediate carrier, then a layer of semi-insulating SiC is grown by epitaxy on the transferred layer of SiC to form the donor substrate.

Figure 2A:
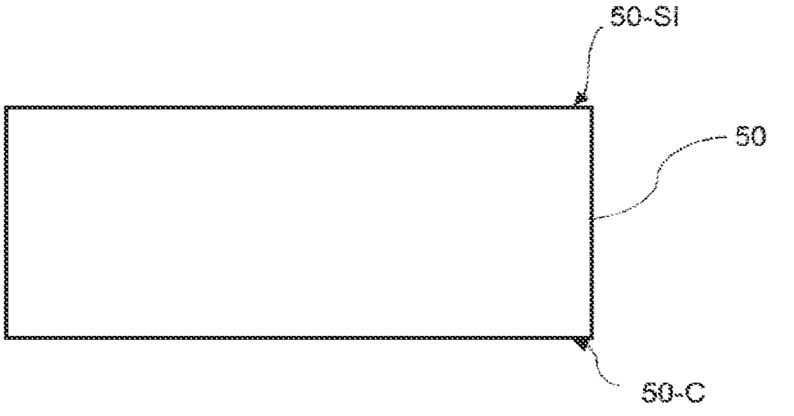
FIG. 2A is a schematic cross-sectional view of a first single-crystal SiC donor substrate.

With reference to FIG. 2A, an initial substrate 50 of single-crystal SiC having an excellent crystal quality, i.e., in particular, a substrate free of dislocations, is provided.

In certain embodiments, the initial substrate may be a bulk substrate of single-crystal SiC. In other embodiments, the initial substrate may be a composite substrate, comprising a superficial layer of single-crystal SiC and at least one other layer of another material. In this case, the layer of single-crystal SiC will have a thickness larger than or equal to 0.5 μm.

There are various crystal forms (also called polytypes) of silicon carbide. The most common are the forms 4H, 6H and 3C. Preferably, the single-crystal silicon carbide is chosen from the 4H and 6H polytypes, but any polytype may be used to implement embodiments of the present disclosure.

In the figures, a bulk initial substrate 50 made of single-crystal SiC has been shown.

As known per se, as illustrated in FIG. 2A, such a substrate has a silicon face 50-Si and a carbon face 50-C.

The orientation of the initial substrate (silicon face/carbon face) and therefore of the donor substrate during the implementation of the method is chosen depending on the face of the SiC intended for the growth of the layer of GaN.

Particularly advantageously, it is the silicon face 50-Si of the initial substrate 50 that is chosen for the implementation of the steps of the process. Specifically, this is the most conventional orientation in industrial processes involving single-crystal silicon carbide.

Figure 2B:
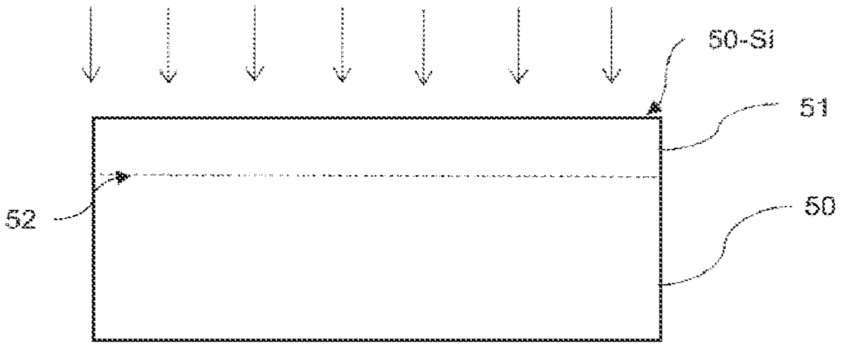
FIG. 2B is a schematic cross-sectional view of the donor substrate of FIG. 2A during the formation of a weakened region via implantation of ionic species through the Si-face of the first donor substrate to form a thin layer of single-crystal SiC to be transferred.

With reference to FIG. 2B, ionic species are implanted (schematically represented by the arrows) through the silicon face 50-Si of the initial substrate 50 so as to form a weakened region 52 that defines a thin layer 51 of single-crystal SiC to be transferred.

The implanted species typically comprise hydrogen and/or helium. A person skilled in the art will be able to define the required implantation dose and energy.

Preferably, the thin layer 51 of single-crystal semi-insulating SiC has a thickness smaller than 1 μm. Specifically, such a thickness is accessible on an industrial scale with the Smart Cut™ process. In particular, the implantation devices available on industrial fabrication lines allow such an implantation depth to be obtained.

Figure 2C:
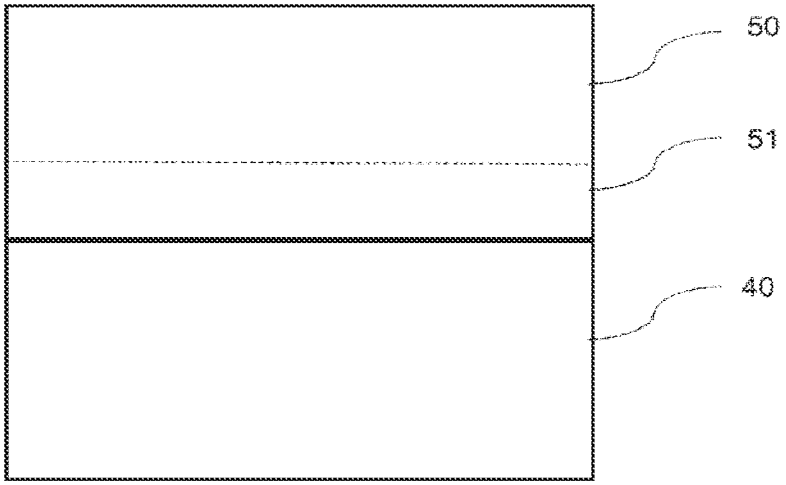
FIG. 2C is a schematic cross-sectional view of assembly of a first receiver substrate and of the first donor substrate of FIG. 2B.

With reference to FIG. 2C, the silicon face 50-Si of the initial substrate 50 is bonded to an intermediate carrier 40.

The main function of the intermediate carrier 40 is to temporarily hold the layer 51 of single-crystal SiC between its transfer from the initial substrate and the growth of a layer of semi-insulating SiC on the layer of single-crystal SiC.

To this end, the intermediate carrier 40 is chosen to have a coefficient of thermal expansion substantially equal to that of the SiC, in order not to generate stresses or strains during the epitaxy of the semi-insulating SiC. Thus, particularly advantageously, the intermediate carrier and the initial substrate (or the layer of single-crystal SiC in the case of a composite initial substrate) have a difference in coefficient of thermal expansion smaller than or equal to $3\times10^{-6}$ $K^{-1}$ in absolute value.

Preferably, the intermediate carrier is also made of SiC so as to minimize the difference in coefficient of thermal expansion. Particularly advantageously, the intermediate carrier 40 is an SiC substrate having a crystal quality lower than that of the initial substrate. What is meant by that is that the intermediate carrier may be a polycrystalline SiC substrate, or indeed a substrate of single-crystal SiC but that may comprise dislocations of all types (contrary to the single-crystal SiC of the initial substrate which is chosen for an excellent crystal quality to ensure the quality of the epitaxial layer of semi-insulating SiC). Such a substrate of lower crystal quality has the advantage of being less expensive than a substrate of same quality as the initial substrate, while being perfectly adapted to the function of temporary carrier.

The bonding of the initial substrate to the intermediate carrier is advantageously direct, i.e., without use of a bonding layer at the interface between the initial substrate and the intermediate carrier. Optionally, at least one of the surfaces to be brought into contact may be cleaned and/or activated, for example, via bombardment with neutral species, to increase bonding energy.

Alternatively, the initial substrate may be bonded to the intermediate carrier via a bonding layer (not shown) made of a refractory material, able to withstand the temperature of epitaxy of the semi-insulating SiC without degrading.

Figure 2D:
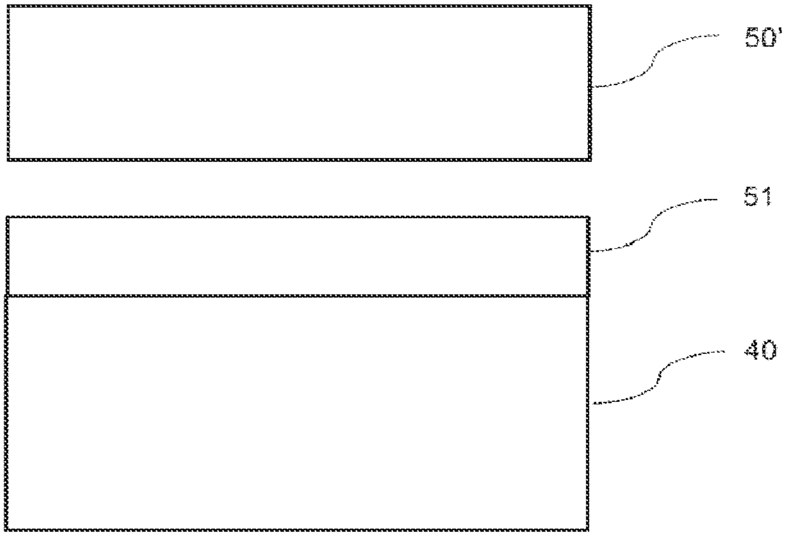
FIG. 2D is a schematic cross-sectional view of the first donor substrate being detached along the weakened region to transfer the thin single-crystal layer to the first receiver substrate.

With reference to FIG. 2D, the initial substrate 50 is detached along the weakened region 52. In a way known per se, the detachment may be caused by a heat treatment, a mechanical action, or a combination of these means.

The effect of this detachment is to transfer the layer 51 of single-crystal SiC to the intermediate carrier 40.

Figure 2E:
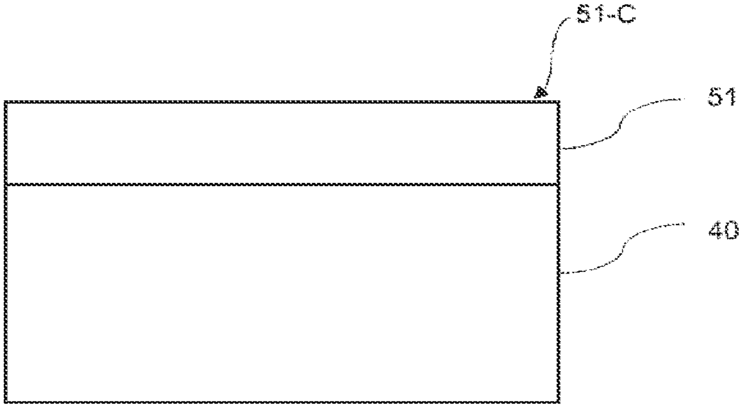
FIG. 2E is a schematic cross-sectional view of the thin layer of single-crystal SiC transferred to the first receiver substrate after its free surface (carbon face) has been polished.

As illustrated in FIG. 2E, the free face of the transferred layer 51 of single-crystal SiC is the carbon face 51-C (the silicon face being on the side of the interface with the intermediate carrier 40). This face is polished, for example, by chemical-mechanical polishing (CMP), to decrease the roughness of the layer 51 and to remove defects related to the implantation. The intermediate carrier 40 and the transferred layer 51 of single-crystal SiC together form the base substrate such as described in the embodiment illustrated in FIGS. 1A to 1I; it is the carbon face of the single-crystal SiC that is uncovered (as in the first embodiment), the step of transferring to the intermediate carrier having made it possible to start with a base substrate with the silicon face uncovered.

The remainder 50' of the initial substrate (see FIG. 2D) may advantageously be recycled with a view to a new use. To this end, the remainder may be the subject of a polish allowing defects related to the implantation to be removed. It may then be reused by way of new initial substrate as illustrated in FIG. 2A.

The rest of the process comprises similar steps to the steps described with reference to FIGS. 1B to 1I, and that will therefore be described in a briefer fashion here.

Figure 2F:
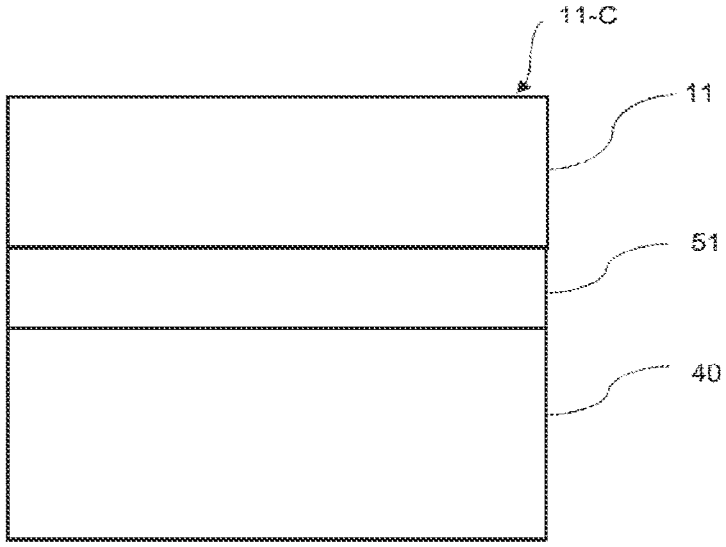
FIG. 2F is a schematic cross-sectional view of a second donor substrate formed by epitaxial growth of a layer of single-crystal semi-insulating SiC on the carbon face of the layer of single-crystal SiC of the substrate of FIG. 2E.

With reference to FIG. 2F, an epitaxial growth of a layer 11 of semi-insulating SiC on the layer 51 of the base substrate 10 is performed, to form the donor substrate. The polytype of the semi-insulating SiC is advantageously identical to that of the SiC of the initial substrate.

Since the growth of the layer 11 is performed on the carbon face 51-C of the base substrate, it is the carbon face 11-C of the semi-insulating SiC that is located on the surface of the donor substrate.

The layer of semi-insulating SiC advantageously has a thickness larger than the thickness of the layer to be subsequently transferred to the receiver substrate.

Figure 2G:
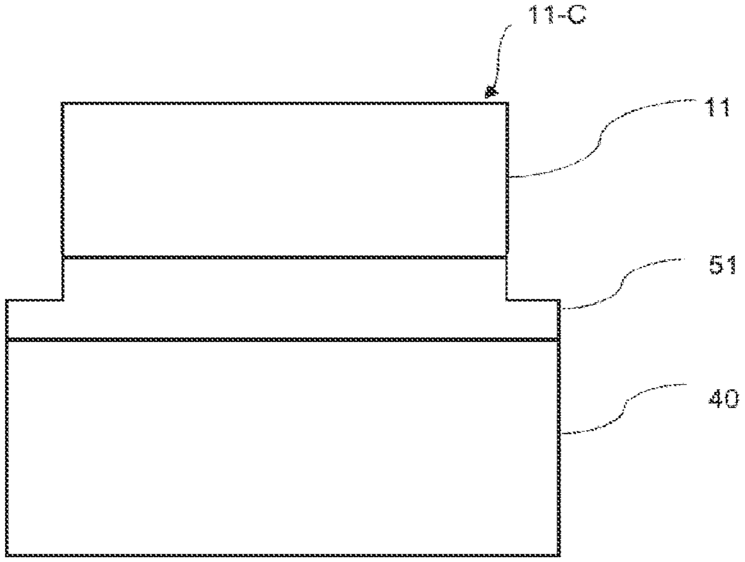
FIG. 2G is a schematic cross-sectional view of the second donor substrate after edging intended to remove an SiC outgrowth formed on the edges of the donor substrate during the epitaxy.

With reference to FIG. 2G, the layer 11 of semi-insulating SiC and a subjacent segment of the base substrate 10 is trimmed.

Figure 2H:
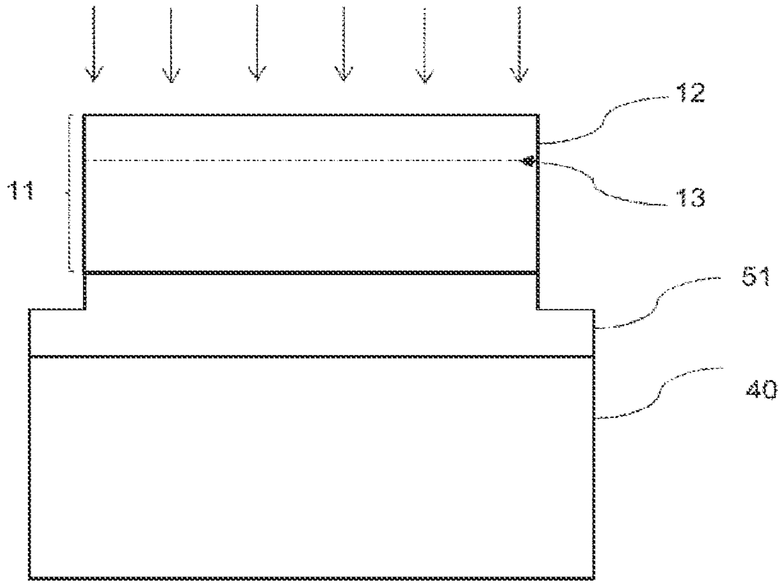
FIG. 2H is a schematic cross-sectional view of the second donor substrate of FIG. 2G during the formation of a weakened region via implantation of ionic species in the layer of semi-insulating SiC to define a thin layer to be transferred.

With reference to FIG. 2H, ionic species are implanted into the layer 11 of semi-insulating SiC of the donor substrate, so as to form a weakened region 13 that defines a thin layer 12 of single-crystal semi-insulating SiC.

On account of the initial orientation of the base substrate, the ionic species are implanted through the carbon face 51-C of the donor substrate.

Preferably, the thin layer 12 of single-crystal semi-insulating SiC has a thickness smaller than 1 μm, which is accessible on an industrial scale with the Smart Cut™ process.

Figure 2I:
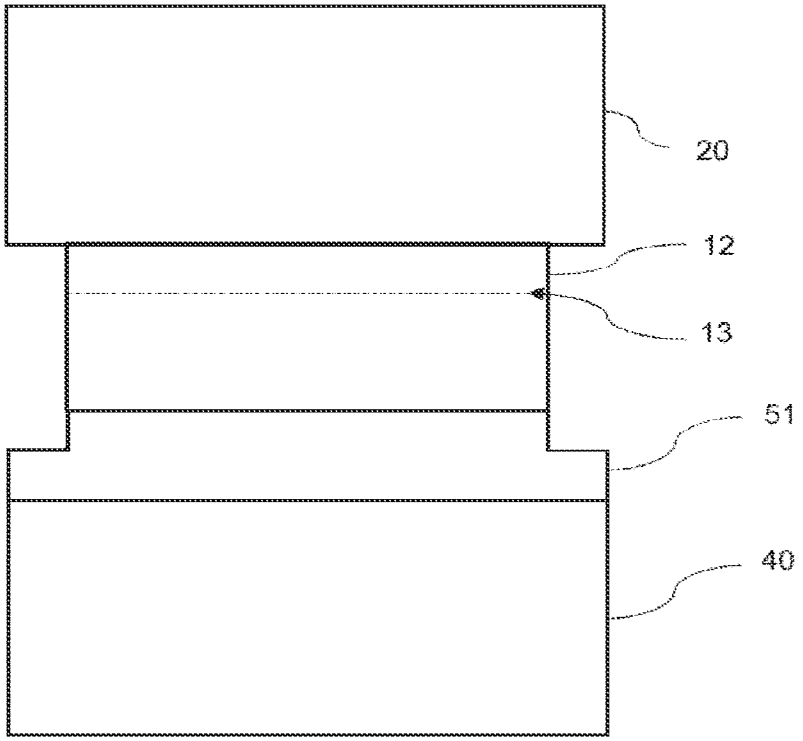
FIG. 2I is a schematic cross-sectional view of assembly of a second receiver substrate and of the second donor substrate of FIG. 2H.

With reference to FIG. 2I, a receiver substrate 20 having a high electrical resistivity is moreover provided.

The main function of the receiver substrate 20 is to form, with the layer 12 of semi-insulating SiC transferred to the receiver substrate, a substrate suitable for the epitaxial growth of GaN.

Since the epitaxy is performed at high temperatures, the receiver substrate is preferably chosen to have a coefficient of thermal expansion substantially equal to that of SiC, in order not to generate stress or strain during the epitaxy of the GaN. Thus, particularly advantageously, the receiver substrate has, with SiC, a difference in coefficient of thermal expansion smaller than or equal to $3\times10^{-6}$ $K^{-1}$ in absolute value.

Moreover, apart from its high electrical resistivity, the receiver substrate advantageously contributes to the dissipation of heat within the final structure. A material having a high thermal conductivity is therefore advantageously chosen for the receiver substrate.

Thus, preferred materials for the receiver substrate are: ceramics (for example, but non-limitingly polycrystalline SiC (pSiC), polycrystalline aluminum nitride (pAlN), beryllium oxide (BeO)), diamond, or, to a lesser extent, silicon of electrical resistivity higher than or equal to 100 Ω·cm (the thermal conductivity of the latter being lower than that of the other materials mentioned).

The layer 11 of semi-insulating SiC of the donor substrate is bonded to the receiver substrate 20. It is a question of direct bonding, i.e., bonding without use of a bonding layer—which would be liable to form a thermal barrier—interposed between the substrates.

Figure 2J:
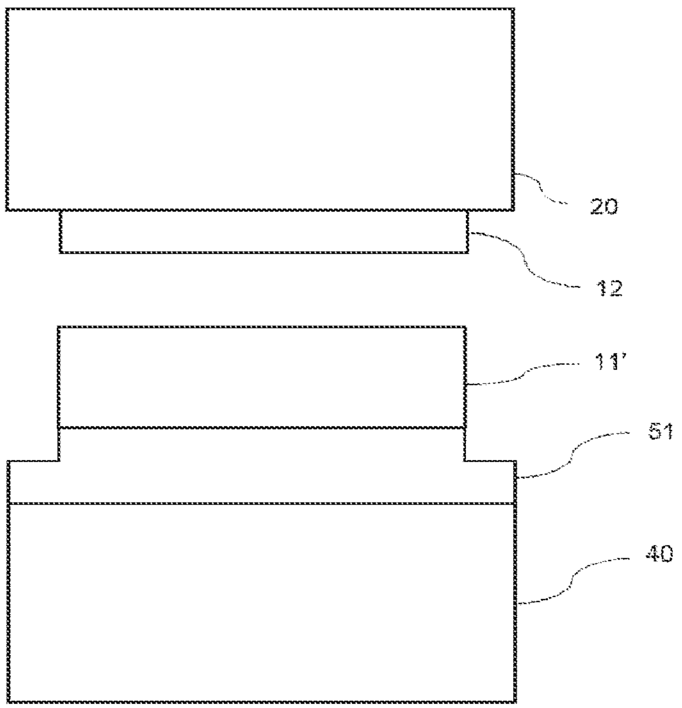
FIG. 2J is a schematic cross-sectional view of the second donor substrate being detached along the weakened region to transfer the thin layer of single-crystal semi-insulating SiC to the second receiver substrate.

With reference to FIG. 2J, the donor substrate is detached along the weakened region 13.

The effect of this detachment is to transfer the layer 12 of semi-insulating SiC to the receiver substrate 20.

Figure 2K:
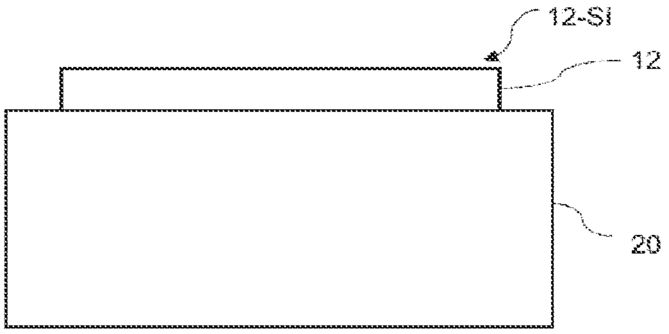
FIG. 2K is a schematic cross-sectional view of the thin layer of single-crystal semi-insulating SiC transferred to the second receiver substrate after its free surface (silicon face) has been polished.

As illustrated in FIG. 2K, the free face of the transferred layer 12 of single-crystal SiC is the silicon face 12-Si (the carbon face being on the side of the interface with the receiver substrate 20). This face is polished, for example, by chemical-mechanical polishing (CMP), to decrease the roughness of the layer 12 and to remove defects related to the implantation.

The remainder of the donor substrate, which comprises the base substrate and the segment 11' of the layer 11 of semi-insulating SiC that was not transferred to the receiver substrate 20 (see FIG. 2J), may advantageously be recycled with a view to a new use.

The various modes of recycling have already been described above.

Returning to the substrate of FIG. 2K, the substrate is suitable for growing a III-N alloy based on gallium on the transferred layer 12 of semi-insulating SiC.

Figure 2L:
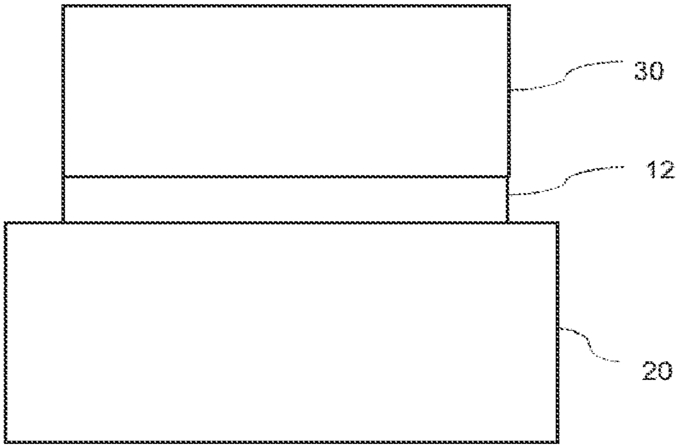
FIG. 2L is a schematic cross-sectional view of a layer of GaN being formed on the silicon face of the layer of single-crystal semi-insulating SiC of FIG. 2K.

With reference to FIG. 2L, a layer 30 of GaN (or, as mentioned above, of AlGaN or InGaN) is grown on the silicon face of the layer 12 of semi-insulating SiC. The thickness of the layer 30 is typically between 1 μm and 2 μm.

Figure 2M:
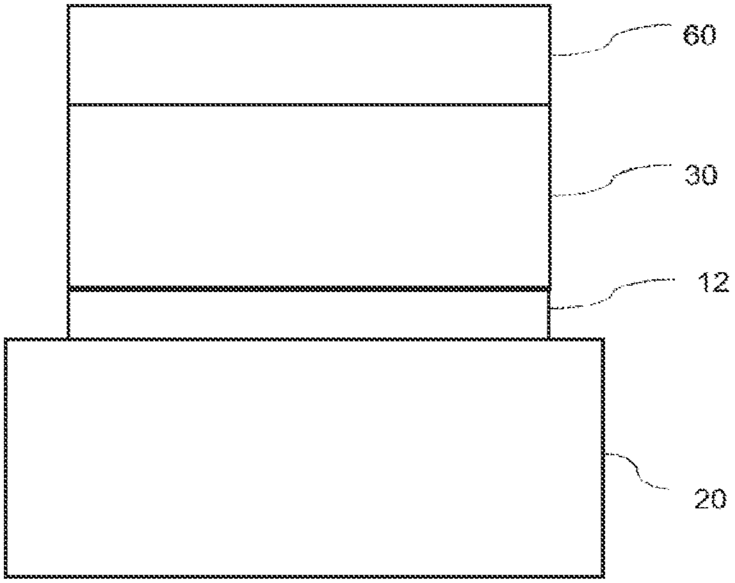
FIG. 2M is a schematic cross-sectional view of the formation by epitaxy of a heterojunction on the layer of GaN of FIG. 2L.

Next, as illustrated in FIG. 2M, a heterojunction is formed by growing, by epitaxy, on the layer 30, a layer 60 of a III-N alloy different from that of the layer 30.

It is thus possible to continue the fabrication of transistors, in particular, HEMTs, from this heterojunction, using processes known to those skilled in the art, the channel of the transistor being formed level with the heterojunction, and the source, drain and gate of the transistor being formed on the channel.

Whatever the embodiment, the structure thus obtained is particularly advantageous in that it comprises a layer of semi-insulating SiC, which on the one hand serves as seed for the epitaxial growth of the layer of III-N alloy and on the other hand both dissipates heat well and limits RF losses, and which is obtained at lower cost. Moreover, the receiver substrate, which bears the layer of semi-insulating SiC, and which has both a high electrical resistivity and a high thermal conductivity, makes direct contact with the layer, so that the structure does not comprise any thermal barrier.

REFERENCES

[1] Comparative study on stress in AlGaN/GaN HEMT structures grown on 6H—SiC, Si and on composite substrates of the 6H—SiC/poly-SiC and Si/poly-SiC, M. Guziewicz et al., Journal of Physics: Conference Series 100 (2008) 040235

The invention claimed is:

1. A method of fabricating a substrate for epitaxial growth of a layer of gallium nitride (GaN), aluminum gallium nitride (AlGaN) or indium gallium nitride (InGaN), comprising the following successive steps:

providing a base substrate comprising at least one layer of single-crystal silicon carbide;

performing epitaxial growth of a layer of semi-insulating SiC on the layer of single-crystal SiC to form a donor substrate;

implanting ionic species into the layer of semi-insulating SiC so as to form a weakened region that defines a thin layer of single-crystal semi-insulating SiC to be transferred;

bonding the layer of semi-insulating SiC to a receiver substrate having a high electrical resistivity; and detaching the donor substrate along the weakened region so as to transfer the thin layer of single-crystal semi-insulating SiC to the receiver substrate.

2. The method of claim 1, wherein the receiver substrate has a difference in coefficient of thermal expansion with silicon carbide smaller than or equal to $3\times10^{-6}$ $K^{-1}$.

3. The method of claim 1, wherein the receiver substrate is chosen from among the group consisting of a silicon substrate of high electrical resistivity, a substrate of polycrystalline SiC of high electrical resistivity, a polycrystalline AlN substrate, and a diamond substrate.

4. The method of claim 1, wherein the epitaxial layer of semi-insulating SiC has a thickness larger than or equal to 3 μm.

5. The method of claim 1, wherein the thin layer transferred to the receiver substrate has a thickness smaller than 1 μm.

6. The method of claim 1, wherein the layer of semi-insulating SiC is formed by doping with vanadium during the epitaxial growth of the SiC.

7. The method of claim 1, further comprising a step of recycling a remainder of the donor substrate detached from the transferred layer.

8. The method of claim 7, wherein the recycling comprises polishing a residual segment of the layer of semi-insulating SiC.

9. The method of claim 7, wherein the recycling comprises polishing a residual segment of the layer of semi-insulating SiC and performing epitaxial regrowth to increase a thickness of the layer of semi-insulating SiC to form a new donor substrate.

10. The method of claim 7, wherein the recycling comprises removing a residual segment of the layer of semi-insulating SiC to uncover a carbon face of the layer of single-crystal SiC and performing epitaxial growth of a new layer of semi-insulating SiC on the carbon face of the layer of single-crystal SiC to form a new donor substrate.

11. The method of claim 1, wherein:

the layer of single-crystal silicon carbide of the base substrate has a free carbon face;

the epitaxial growth of the layer of semi-insulating SiC is performed on the carbon face of the layer of single-crystal SiC;

the ionic species are implanted through the carbon face of the layer of semi-insulating SiC;

the carbon face of the layer of semi-insulating SiC is bonded to the receiver substrate; and at the end of the detachment, the silicon face of the transferred layer of single-crystal semi-insulating SiC is uncovered.

12. The method of claim 1, further comprising fabricating the base substrate via the following successive steps:

providing an initial substrate of single-crystal SiC having a silicon face;

implanting ionic species through the silicon face of the initial substrate so as to form a weakened region that defines a thin layer of single-crystal SiC to be transferred;

bonding the silicon face of the initial substrate to an intermediate carrier; and detaching the initial substrate along the weakened region so as to transfer the thin layer of single-crystal SiC to the intermediate carrier and to uncover the carbon face of the transferred layer of single-crystal SiC, the intermediate carrier and the transferred layer of single-crystal SiC together forming the base substrate.

13. The method of claim 12, wherein the intermediate carrier is an SiC substrate having a crystal quality lower than a crystal quality of the initial substrate.

14. The method of claim 12, wherein the initial substrate is bonded directly to the intermediate carrier after activation of each surface to be bonded by bombardment of neutral species.

15. The method of claim 12, wherein the initial substrate is bonded to the intermediate carrier by a refractory bonding layer.

16. The method of claim 12, further comprising a step of recycling a remainder of the initial substrate detached from the transferred layer.

17. A method of fabricating by epitaxy a layer of gallium nitride, aluminum gallium nitride (AlGaN) or indium gallium nitride (InGaN), comprising:

providing a substrate fabricated using the method according to claim 1; and performing epitaxial growth of the layer of gallium nitride, aluminum gallium nitride (AlGaN) or indium gallium nitride (InGaN) on the layer of semi-insulating SiC of the substrate.

18. The method of claim 17, wherein the layer of gallium nitride, aluminum gallium nitride (AlGaN) or indium gallium nitride (InGaN) has a thickness between 1 and 2 μm.

19. A method of fabricating a high-electron-mobility transistor (HEMT), comprising:

fabricating by epitaxy the layer of gallium nitride, aluminum gallium nitride (AlGaN) or indium gallium nitride (InGaN) using the process according to claim 17;

forming a heterojunction by epitaxy of a layer of a III-N material different from gallium nitride on the layer of gallium nitride, aluminum gallium nitride (AlGaN) or indium gallium nitride (InGaN);

forming a channel of the transistor level with the heterojunction; and forming a source, a drain and a gate of the transistor on the channel.

20. The method of claim 4, wherein the epitaxial layer of semi-insulating SiC has a thickness larger than or equal to 10 μm.

* * * * *